(12) United States Patent
Viscarra et al.

(10) Patent No.: US 10,333,212 B2
(45) Date of Patent: Jun. 25, 2019

(54) RADIATOR, SOLDERLESS INTERCONNECT THEREOF AND GROUNDING ELEMENT THEREOF

(71) Applicant: Raytheon Company, Waltham, MA (US)

(72) Inventors: Alberto F. Viscarra, Torrance, CA (US); Jayna Shah, Plano, TX (US)

(73) Assignee: RAYTHEON COMPANY, Waltham, MA (US)

(*) Notice: Subject to any disclaimer, the term of this patent is extended or adjusted under 35 U.S.C. 154(b) by 35 days.

(21) Appl. No.: 15/494,039

(22) Filed: Apr. 21, 2017

(65) Prior Publication Data

US 2017/0229771 A1    Aug. 10, 2017

Related U.S. Application Data

(62) Division of application No. 14/579,568, filed on Dec. 22, 2014, now Pat. No. 9,660,333.

(51) Int. Cl.
    *H01R 12/00* (2006.01)
    *H01Q 1/48* (2006.01)
    (Continued)

(52) U.S. Cl.
    CPC ............. *H01Q 1/48* (2013.01); *H01Q 13/085* (2013.01); *H01Q 13/10* (2013.01);
    (Continued)

(58) Field of Classification Search
    CPC ...... H01R 4/64; H01R 9/035; H01R 13/6583; H01R 13/6589; H01R 13/6592;
    (Continued)

(56) References Cited

U.S. PATENT DOCUMENTS

| 3,414,892 A | 12/1968 | McCormack et al. |
| 3,528,050 A | 9/1970 | Hindenburg |

(Continued)

FOREIGN PATENT DOCUMENTS

| EP | 1467430 | 10/2004 |
| EP | 2154747 A1 | 2/2010 |

(Continued)

OTHER PUBLICATIONS

ISR/WO, dated Mar. 23, 2016, RAY0288PCT, PCT Application No. PCT/US15/56848, 18 pages.

(Continued)

*Primary Examiner* — Linh V Nguyen
(74) *Attorney, Agent, or Firm* — Cantor Colburn LLP

(57) ABSTRACT

A radiator includes an aperture plate defining multiple slots in first and second transverse directions, spring probes disposed within each of the multiple slots, printed circuit boards (PCBs) each having major and minor surfaces and being recessed on either side of multiple portions of one of the minor surfaces to define multiple pads plated with conductive pad material electrically interconnected with a PCB circuit and a grounding element. Each of the PCBs is disposed with the corresponding one of the minor surfaces inserted into a slot such that the PCBs form a crisscrossing pattern and the pads form horizontal blind-mate contacts with the spring probes that are in-plane with corresponding PCB planes. The grounding element is interposed between crisscrossing PCB pairs at complementary notches thereof.

20 Claims, 10 Drawing Sheets

(51) Int. Cl.
  *H01R 4/48* (2006.01)
  *H01R 4/64* (2006.01)
  *H01Q 13/10* (2006.01)
  *H05K 1/11* (2006.01)
  *H01Q 13/08* (2006.01)
  *H01Q 21/00* (2006.01)
  *H01Q 21/06* (2006.01)

(52) U.S. Cl.
  CPC ..... *H01Q 21/0006* (2013.01); *H01Q 21/0025* (2013.01); *H01Q 21/0087* (2013.01); *H01Q 21/064* (2013.01); *H01Q 21/067* (2013.01); *H01R 4/48* (2013.01); *H01R 4/64* (2013.01); *H05K 1/111* (2013.01)

(58) Field of Classification Search
  CPC .. H01R 9/0527; H01R 12/598; H01R 12/714; H01R 13/187; H01R 13/6205; H01R 13/6275; H01R 13/6582; H01R 13/7033; H01R 13/73; H01R 2107/00; H01R 24/58; H01R 24/60; H01R 25/006; H01R 4/66; H01R 9/031; H01R 9/032; H01R 9/0524
  USPC ................ 439/74, 567–570, 607.35, 607.36
  See application file for complete search history.

(56) References Cited

U.S. PATENT DOCUMENTS

| | | | |
|---|---|---|---|
| 3,624,587 A | 11/1971 | Conrad | |
| 3,960,424 A | 6/1976 | Weisenburger | |
| 4,479,686 A | 10/1984 | Hoshino et al. | |
| 4,690,471 A | 9/1987 | Marabotto | |
| 5,060,369 A | 10/1991 | Date | |
| 5,146,308 A | 9/1992 | Chance et al. | |
| 5,244,395 A | 9/1993 | DeSantis et al. | |
| 5,338,207 A | 8/1994 | Lineberry et al. | |
| 5,355,283 A | 10/1994 | Marrs et al. | |
| 5,435,757 A * | 7/1995 | Fedder | H01R 13/11 439/686 |
| 5,603,620 A | 2/1997 | Hinze | |
| 5,644,277 A | 7/1997 | Gulick | |
| 5,661,901 A | 9/1997 | King | |
| 5,886,590 A | 3/1999 | Quan | |
| 5,938,455 A | 8/1999 | Glovatsky et al. | |
| 6,045,389 A * | 4/2000 | Ferrill | H01R 9/031 439/398 |
| 6,100,775 A | 8/2000 | Wen | |
| 6,114,221 A | 9/2000 | Tonti et al. | |
| 6,166,701 A | 12/2000 | Park et al. | |
| 6,307,160 B1 | 10/2001 | Mei et al. | |
| 6,386,914 B1 * | 5/2002 | Collins | H01R 9/0527 439/579 |
| 6,664,867 B1 | 12/2003 | Chen | |
| 6,822,617 B1 | 11/2004 | Mather et al. | |
| 6,830,460 B1 | 12/2004 | Rathburn | |
| 6,882,247 B2 | 4/2005 | Allison | |
| 6,891,511 B1 | 5/2005 | Angelucci | |
| 6,935,866 B2 | 8/2005 | Kerekes | |
| 6,950,062 B1 | 9/2005 | Mather et al. | |
| 6,971,916 B2 * | 12/2005 | Tokunaga | H01R 23/688 409/108 |
| 7,132,990 B2 | 11/2006 | Stenger | |
| 7,193,490 B2 | 3/2007 | Shimoda | |
| 7,229,315 B2 * | 6/2007 | Zhang | H01R 13/658 439/607.31 |
| 7,444,736 B1 | 11/2008 | Warning | |
| 7,476,110 B2 * | 1/2009 | Lemke | H01R 12/57 29/840 |
| 7,717,719 B2 * | 5/2010 | Miyazaki | H01R 12/57 439/74 |
| 7,845,954 B2 | 12/2010 | Tomura et al. | |
| 8,035,992 B2 | 10/2011 | Kushta | |
| 8,659,499 B1 | 2/2014 | Pluymers | |
| 8,753,145 B2 | 6/2014 | Lang | |
| 8,888,506 B2 * | 11/2014 | Nishimura | H01R 12/7082 439/74 |
| 9,077,083 B1 | 7/2015 | Freeman et al. | |
| 9,166,343 B1 * | 10/2015 | Jeon | H01R 13/6587 |
| 9,190,727 B1 | 11/2015 | Urcia et al. | |
| 9,356,369 B2 * | 5/2016 | Tamai | H01R 12/7082 |
| 9,373,881 B2 | 6/2016 | Thompson et al. | |
| 9,799,994 B2 * | 10/2017 | Chen | H01R 12/775 |
| 9,979,112 B2 * | 5/2018 | Kato | H01R 13/2428 |
| 2002/0024348 A1 | 2/2002 | Jones et al. | |
| 2002/0037656 A1 | 3/2002 | Murakami | |
| 2002/0139579 A1 | 10/2002 | Kward | |
| 2003/0020654 A1 | 1/2003 | Navarro et al. | |
| 2004/0188836 A1 | 9/2004 | Key et al. | |
| 2005/0095896 A1 | 5/2005 | Tutt | |
| 2005/0269693 A1 | 12/2005 | Green et al. | |
| 2006/0097944 A1 | 5/2006 | McCarville et al. | |
| 2007/0173080 A1 | 7/2007 | Johnson et al. | |
| 2008/0102702 A1 | 5/2008 | Sercu et al. | |
| 2009/0197435 A1 | 8/2009 | Jessup et al. | |
| 2009/0213562 A1 | 8/2009 | Thevenard et al. | |
| 2009/0322620 A1 | 12/2009 | Pedersen et al. | |
| 2010/0053026 A1 | 3/2010 | Van Der Poel | |
| 2010/0112826 A1 | 5/2010 | Frasco | |
| 2010/0186997 A1 | 7/2010 | Vicich | |
| 2011/0291907 A1 | 12/2011 | Puzella et al. | |
| 2012/0034820 A1 | 2/2012 | Lang | |
| 2012/0212920 A1 | 8/2012 | Schreffler | |
| 2012/0287581 A1 | 11/2012 | Sauerbier | |
| 2013/0003330 A1 | 1/2013 | Chen | |
| 2013/0175078 A1 | 7/2013 | Pai | |
| 2013/0194754 A1 | 8/2013 | Jung | |
| 2013/0314292 A1 | 11/2013 | Maley | |
| 2013/0335931 A1 | 12/2013 | Snider et al. | |
| 2014/0004745 A1 | 1/2014 | Komoto et al. | |
| 2014/0152510 A1 | 6/2014 | Manry, Jr. et al. | |

FOREIGN PATENT DOCUMENTS

| | | |
|---|---|---|
| EP | 2626897 A1 | 8/2013 |
| EP | 2704259 A2 | 3/2014 |
| FR | 2575336 A1 | 6/1986 |
| GB | 2508679 A | 6/2014 |
| JP | H11121896 A | 4/1999 |
| JP | H11145648 A | 5/1999 |
| JP | 2006040870 A | 2/2006 |
| JP | 2008251702 A | 10/2008 |
| JP | 2008306159 A | 12/2008 |
| JP | 2013060037 A | 4/2013 |
| JP | 2014103295 A | 6/2014 |
| WO | 2005119765 A2 | 12/2005 |
| WO | 2007007450 A1 | 1/2007 |
| WO | 2013038851 A1 | 3/2013 |

OTHER PUBLICATIONS

ISR/WO, dated Oct. 27, 2015, RAY0283PCT, PCT Application No. PCT/US2015/043563, 10 pages.
OA dated May 29, 2018 RAY0283JP, JP Application No. 2017-518881, 6 pages.
OA dated Jan. 29, 2019 in RAY0283JP, JP Application No. 2017-518881, 6 pages.

* cited by examiner

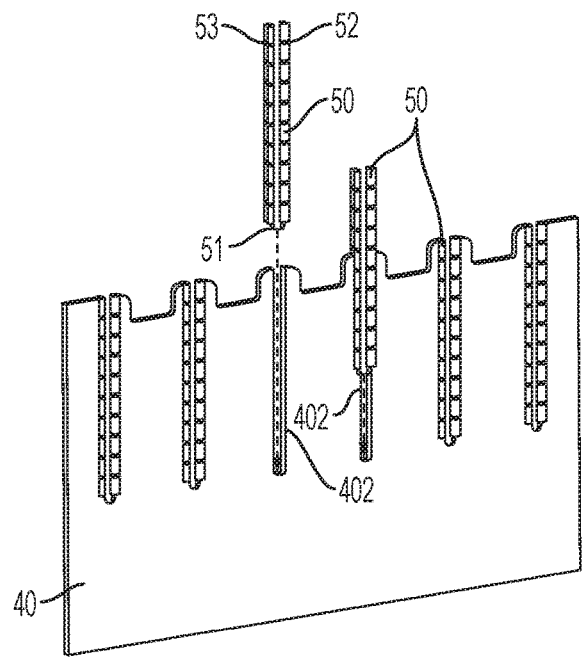
FIG. 6
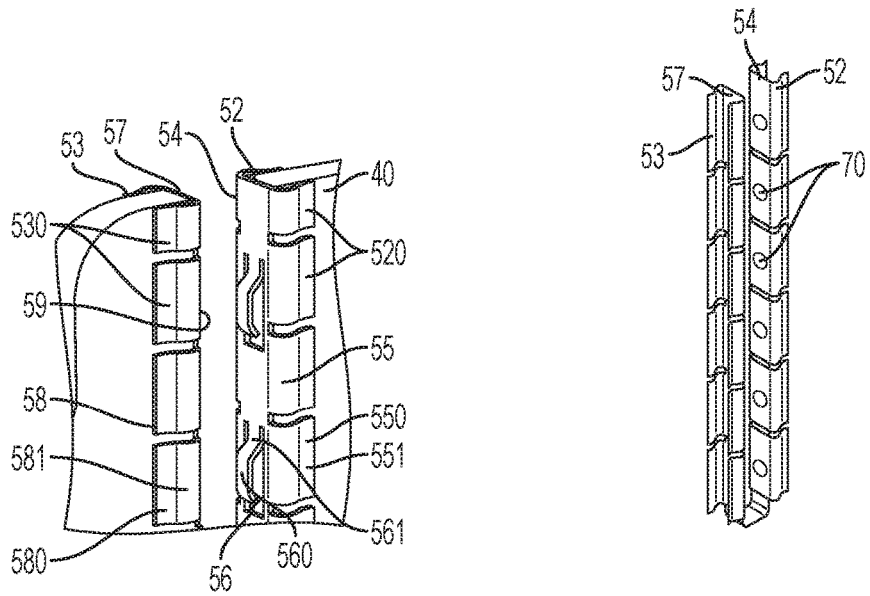
FIG. 7
FIG. 8

RADIATOR, SOLDERLESS INTERCONNECT THEREOF AND GROUNDING ELEMENT THEREOF

DOMESTIC BENEFIT/NATIONAL STAGE INFORMATION

This application is a divisional of U.S. patent application Ser. No. 14/579,568, entitled "RADIATOR, SOLDERLESS INTERCONNECT THEREOF AND GROUNDING ELEMENT THEREOF," which was filed on Dec. 22, 2014. The entire contents are incorporated herein by reference.

BACKGROUND

The present invention relates to a radiator, a solderless interconnect of a radiator and grounding element of a radiator.

Interconnections of a dual-polarized radiator that function at the $K_u$-band (i.e., the 12-18 GHz portion of the electromagnetic spectrum in the microwave range of frequencies) require small feature sizes and a tight connector pitch. Many coaxial interconnections will not fit under these conditional requirements or will require individual cables to be assembled as well. In either case, the coaxial interconnections often require epoxy bonds or solder at each element site. With a large array of element sites, this need for epoxy bonds or solder can leads to high labor and piece part costs while the epoxy or solder joints are themselves potential sources of failure for assemblies subjected to environmental requirements. Moreover, with a large array of radiators, insertion forces required to mate a transmit/receive (T/R) module will be very high.

Previously, interconnections of a dual-polarized radiator have used cables to interconnect to a T/R module, however this method does not allow the module to be replaced without requiring a time consuming disassembly of the antenna. Another method has involved miniaturized soldered interconnects. However, this process has added costs, potential for conductive joint failures, requires relatively large insertion forces and does not enable certain module styles. In still other cases, solderless interconnects into printed circuit boards (PCBs) are made but use a vertical transition (i.e., where the transition is normal to the plane of the PCB) where the contacts hit a pad on the top or bottom of the PCBs.

Meanwhile, current methods of assembling the PCBs to form an array of dual polarized radiators with a common RF ground have drawbacks as well. Generally, silver epoxy is dispensed along all the internal corners of the eggcrate structures formed by the crisscrossing PCBs and cured to hold the assembly together. This process has a high labor cost because automated dispensing of four internal corners for each crisscrossing location is not feasible for dual-polarized unit cell sizes as frequencies approach $K_u$-band and beyond. Also, the length of the corner is often more than 1 inch depending on the design of the radiator, which is beyond some auto dispense capabilities.

SUMMARY

According to one embodiment of the present invention, a radiator is provided and includes an aperture plate defining multiple slots in first and second transverse directions, spring probes disposed within each of the multiple slots, printed circuit boards (PCBs) each having major and minor surfaces and being recessed on either side of multiple portions of one of the minor surfaces to define multiple pads plated with conductive pad material electrically interconnected with a PCB circuit and a grounding element. Each of the PCBs is disposed with the corresponding one of the minor surfaces inserted into a slot such that the PCBs form a crisscrossing pattern and the pads form horizontal blind-mate contacts with the spring probes that are in-plane with corresponding PCB planes. The grounding element is interposed between crisscrossing PCB pairs at complementary notches thereof.

According to another embodiment, a solderless interconnect is provided and includes an aperture plate defining a slot, a spring probe disposed within the slot and a printed circuit board (PCB) having major and minor surfaces. The PCB is recessed on either side of a portion of one of the minor surfaces to define a pad, which is plated with conductive pad material electrically interconnected with a PCB circuit, and the PCB is disposed with the one of the minor surfaces inserted into the slot such that the pad forms a horizontal blind-mate contact with the spring probe that is in-plane with a PCB plane.

According to yet another embodiment, a grounding element for a radiator is provided and includes a hairpin element and first and second legs extending substantially in parallel with each other from opposite ends of the hairpin element. Each of the first and second legs includes an exterior facing elastic grip element and an interior facing elastic grip element.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 6 is a perspective view of a grounding element for use with the radiator of FIGS. 1-4 in accordance with embodiments;

FIG. 7 is an enlarged view of a portion of the grounding element of FIG. 6;

FIG. 8 is an enlarged view of a portion of the grounding element of FIG. 6 in accordance with alternative embodiments;

DETAILED DESCRIPTION

As will be described below, interconnections for a dual-polarized radiator use plated edges on the radiator PCBs and a mounting of the PCBs into a slot on a structural metalized plate. In this manner, the plated edge is allowed to mate with a spring probe to form a horizontal (i.e., parallel to and in-plane with the PCB plane) RF interconnect. Because the spring probe engages to a fully RF matched pad on the edge of PCB, there is no need to solder an additional block or pin to the PCB, thereby removing the cost and potential failure associated with that part and operation. Ground contact is achieved by affixing the PCBs to the metalized plate either mechanically with fasteners that engage blocks on the PCB or by bonding the boards to the plates.

In addition, ground contact between crisscrossing PCBs can be achieved without any manual dispensing and curing in order to reduce manufacturing costs and lead times by the installation of ground clips. Such installation requires no specialized tools and be done on all boards in parallel, improving factory throughput. Ground finger spacing and overhang beyond the board slots can be easily modeled and features can provide additional tuning for the radiator design.

Figure 1:
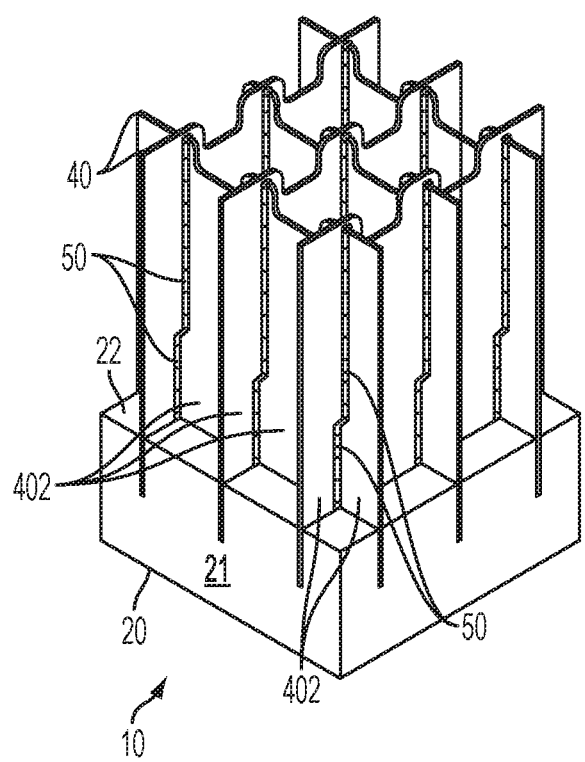
FIG. 1 is a perspective view of a radiator assembly in accordance with embodiments.
Figure 2:
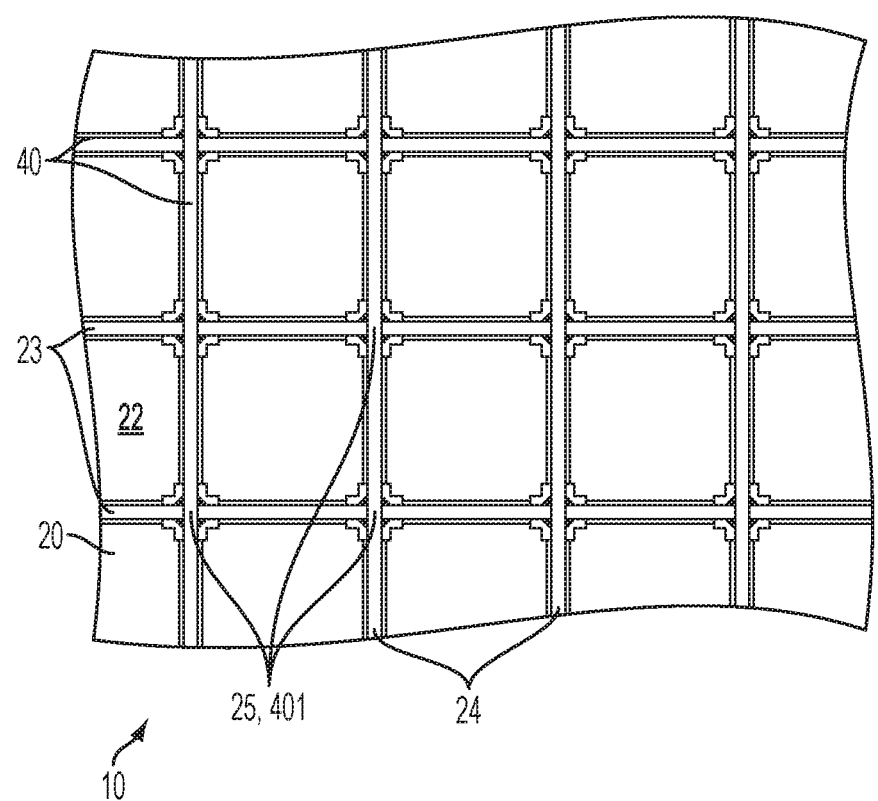
FIG. 2 is a top down view of the radiator assembly of FIG. 1.

With reference to FIGS. 1-4, a dual-polarized, offset notch radiator assembly 10 is provided. The radiator assembly 10 includes an aperture plate 20, spring probes 30 (see FIG. 3), printed circuit boards (PCBs) 40 and grounding elements 50. The aperture plate 20 is made of metal or a metallic alloy and is provided as a volumetric body 21 with a planarized surface 22. As shown in FIG. 2, the planarized surface 22 is marked by a series of multiple slots including first slots 23 that extend in parallel with one another in a first direction and second slots 24 that extend in parallel with one another in a second direction, which is transversely oriented relative to the first direction.

Figure 3:
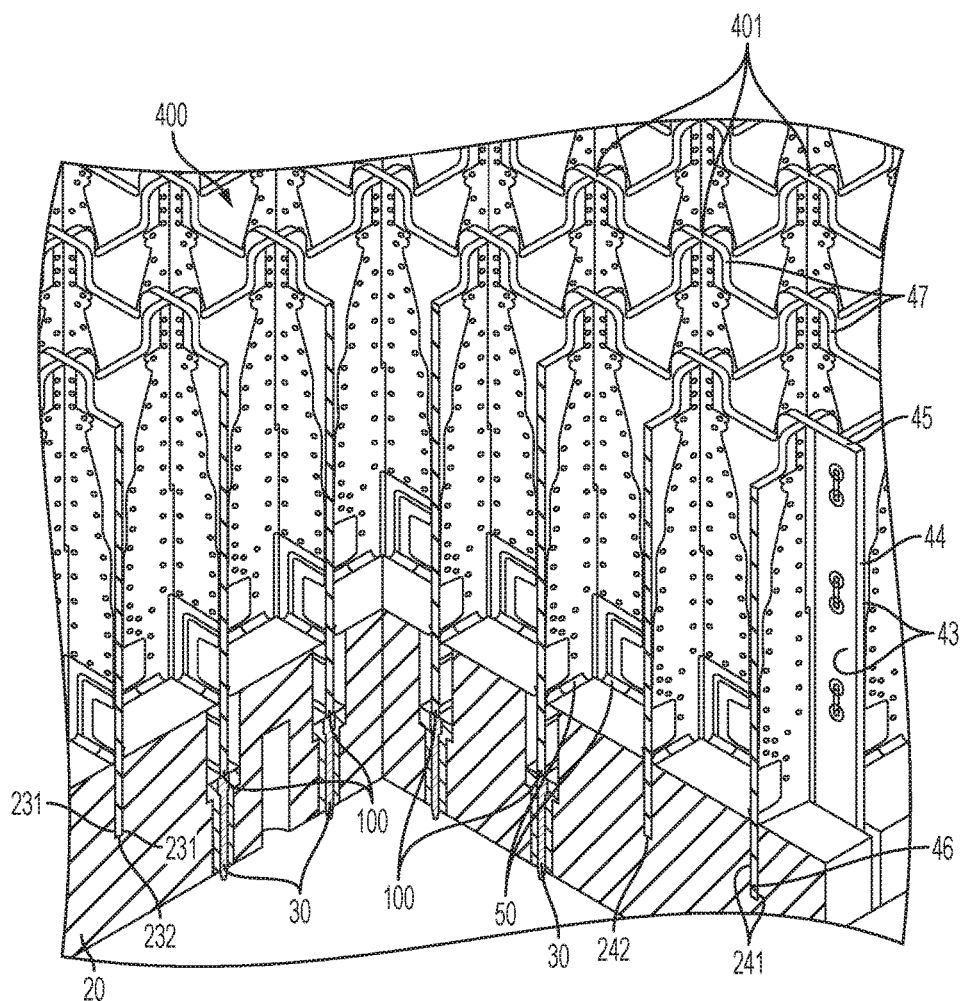
FIG. 3 is a cutaway perspective view of the radiator assembly of FIGS. 1 and 2.

The first slots 23 may extend partially into the body 21 from the planarized surface 22 and include opposing sidewalls 231 and a basewall 232 (as particularly shown in FIG. 3). The basewall 232 extends between the sidewalls 231 at a lowest end of the first slot 23. The second slots 24 may extend partially into the body 21 from the planarized surface 22 and include opposing sidewalls 241 and a basewall 242. The basewall 242 extends between the sidewalls 241 at a lowest end of the second slot 24. The first slots 23 and the second slots 24 intersect with one another to form multiple crisscrossing locations 25 arrayed along the planarized surface 22.

Although the first slots 23 and the second slots 24 are illustrated in FIGS. 1-3 as being perpendicular to one another, it is to be understood that this is not required and that other embodiments exist in which the first slots 23 form non-right angles with the second slots 24 at the crisscrossing locations 25. For the purposes of clarity and brevity, however, the following description will relate to only the perpendicular embodiment.

As shown in FIG. 3, the spring probes 30 may be disposed within the first slots 23 and within the second slots 24. To that end, the spring probes 30 may be provided as a plurality of spring probes 30 with multiple spring probes 30 disposed within at least one of the first slots 23 and at least one of the second slots 24. That is, where multiple spring probes 30 are disposed within a first slot 23, the multiple spring probes 30 may be disposed at regular intervals from one another and, in particular embodiments, the multiple spring probes 30 may be disposed at regular intervals between corresponding crisscrossing locations 25. Similarly, where multiple spring probes 30 are disposed within a second slot 24, the multiple spring probes 30 may be disposed at regular intervals from one another and, in particular embodiments, the multiple spring probes 30 may be disposed at regular intervals between corresponding crisscrossing locations 25.

Figure 4:
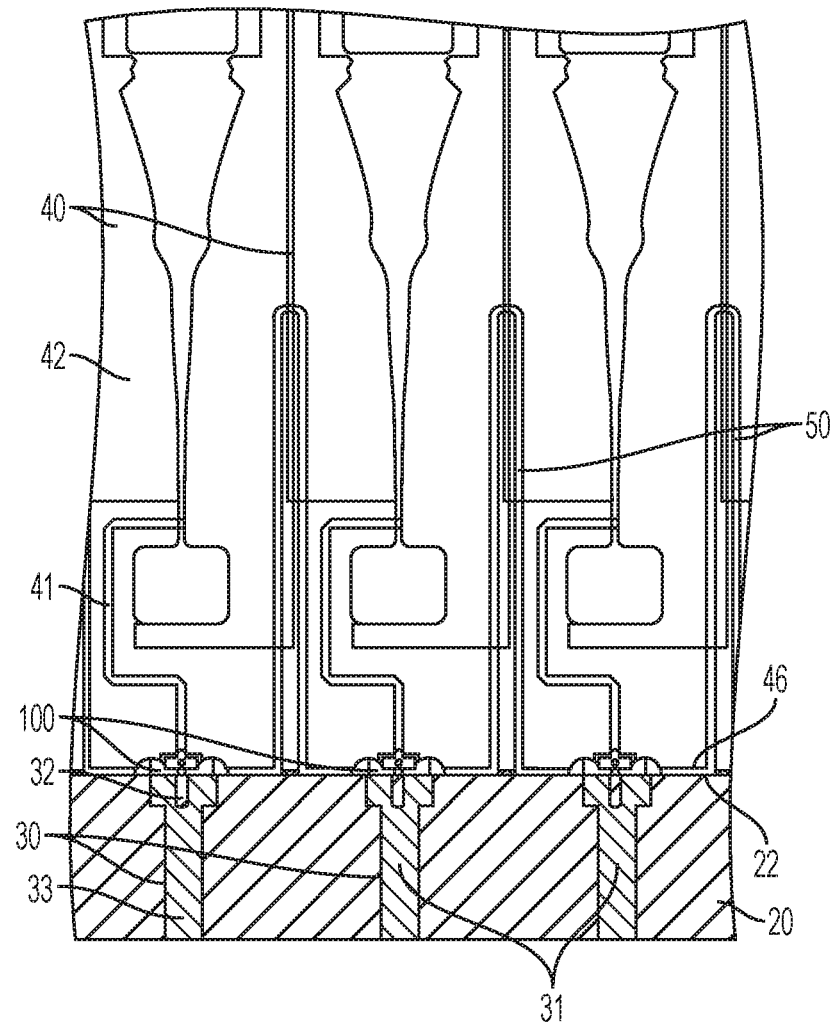
FIG. 4 is a side view of the radiator and interconnects to spring probe of FIGS. 1 and 2.

In any case, with reference to FIGS. 3 and 4, each spring probe 30 may be provided as a radio frequency (RF) spring probe that includes an elongate body 31, which is sized to fit within the corresponding first/second slot 23/24, a spring-loaded probe tip 32 and a probe end tip 33. The spring-loaded probe tip 32 is provided at a first longitudinal end of the spring probe 30 and the probe end tip 33 is provided at a second longitudinal end of the spring probe 30, which is opposite the first longitudinal end. The spring-loaded probe tip 32 is elastically movable along a longitudinal axis of the spring probe 30 and extends partially into the corresponding first/second slot 23/24 with the probe end tip 33 protruding beyond a surface of the aperture plate 20 opposing the planarized surface 22.

Each PCB 40 includes an internal layer of integrated circuitry 41 and an antenna structure 42 coupled to the integrated circuitry 41. More generally, each PCB 40 has first and second opposite major surfaces 43, first and second minor end surfaces 44, a radiative minor surface 45 and a base minor surface 46 (see FIGS. 3 and 4). The antenna structure 42 is disposed on at least one or both of the first and second major surfaces 43. The first and second minor end surfaces 44 oppose one another and are disposed at locations corresponding to opposite ends of the first/second slots 23/24. The radiative minor surface 45 opposes the base minor surface 46 and is disposable to face away from the planarized surface 22. The base minor surface 46 is disposable within a corresponding one of the first/second slots 23/24 as will be described below.

In accordance with embodiments, the radiative minor surface 45 for each PCB 40 may include a series of protrusions 47. The protrusions 47 may be directed to extend away from the planarized surface 22 and may be disposed at regular intervals from one another or, in particular cases, at locations corresponding to the crisscrossing locations 25.

As shown in FIGS. 1 and 3, each of the PCBs 40 is insertable into a corresponding one of the first slots 23 or the second slots 24. With multiple PCBs 40 thus inserted into a corresponding number of first slots 23 and second slots 24, the PCBs 40 form a crisscrossing (or egg carton) pattern 400 that includes multiple PCB crisscrossing locations 401. Each PCB crisscrossing location 401 corresponds to a crisscrossing location 25 and to a corresponding pair of protrusions 47. In addition, each PCB 40 is formed to define multiple notches 402 at locations corresponding to the PCB crisscrossing locations 401 such that the PCBs 40 inserted into the first slots 23 can fit with the PCBs 40 inserted into the second slots 24 (see FIG. 1).

The notches 402 for each PCB 40 may be substantially similar in length or may have differing lengths. For example, the notches 402 for the PCBs 40 inserted into the first slots 23 may be longer than the notches 402 for the PCBs 40 inserted into the second slots 24. In any case, the notches 402 may have lengths that permit flat insertions of each of the PCBs into the first and second slots 23 and 24. In accordance with further embodiments, the notches 402 may be sufficiently wide so as to receive the complementary PCB 40 therein along with the corresponding one of the grounding elements 50 (to be described below).

Figure 5:
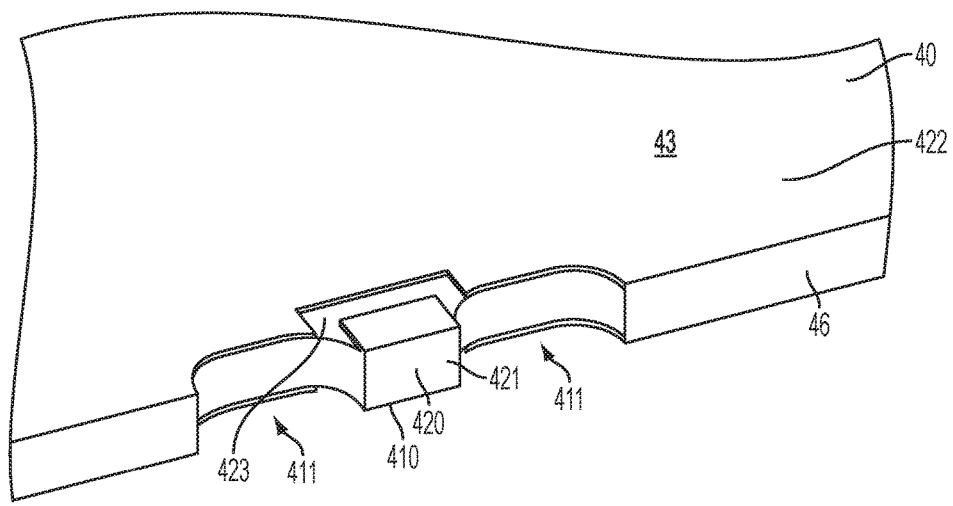
FIG. 5 is a perspective view of a radiator printed circuit board (PCB) in accordance with embodiments.

With reference to FIGS. 3-5, each of the PCBs 40 is disposable with the base minor surface 46 inserted into either one of the first slots 23 or one of the second slots 24. With each of the first slots 23 and the second slots 24 being wider than the PCBs 40, the insertion permits the base minor surface 46 to sit at or near the basewalls 232 and 242. Thus, for a PCB 40 inserted into a first slot 23, the base minor surface 46 sits at or near the basewall 232 and the portions of its first and second major surfaces 43 proximate to the base minor surface 46 complementarily face the sidewalls 231. Similarly, for a PCB 40 inserted into a second slot 24, the base minor surface 46 sits at or near the basewall 242 and the portions of its first and second major surfaces 43 proximate to the base minor surface 46 complementarily face the sidewalls 241.

As shown in FIGS. 4 and 5, the base minor surface 46 of each of the PCBs 40 includes a portion 410 with the PCB 40 being formed to define a recess 411 on either sides of the portion 410 to define the portion 410 as a pad 420. Each recess 411 has an annular shape with a curvature into the body of the PCB 40. The pad 420 may be provided as a planarized surface that is plated with conductive pad material 421, which is coplanar with the base minor surface 46. The conductive pad material 421 may be electrically interconnected with the integrated circuitry 41. In addition, at least the first and second major surfaces 43 and the portions of the base minor surface 46 remote from the pad 420 may be plated with conductive surface material 422 to form, for example, the antenna structures 42. In such cases, the conductive pad material 421 is electrically insulated from the conductive surface material 422 by way of the recesses 411 and by way of a material groove 423 defined on either side of the pad 420.

In accordance with embodiments, the base minor surface 46 of each PCB 40 may include multiple pads 420. The multiple pads 420 may be disposed at regular intervals and, in particular cases, at regular intervals that correspond to the locations of the multiple spring probes 30 disposed in each of the first/second slots 23/24.

With the insertion of each of the PCBs 40 into the first and second slots 23 and 24, the pads 420 each form horizontal blind-mate contacts 100 with spring-loaded probe tips 32 of the spring probes 30 that are in-plane with corresponding PCB planes. That is, for a given pad 420 of a given PCB 40, the pad 420 contacts with a spring-loaded probe tip 32 of a spring probe 30 in one of the first/second slots 23/24 in the plane of the PCB 40. Thus, for a given set of multiple pads 420 of a given PCB 40, the multiple pads 420 each contact with spring-loaded probe tips 32 of corresponding spring probes 30 in one of the first/second slots 23/24 with all of the contacts being horizontal blind-mate contacts 100 in the plane of the PCB 40. Each pad 420 may be RF matched with a corresponding spring probe 30.

Since the pad(s) 420 contacts with the spring-loaded probe tip(s) 32, the spring-loaded probe tip 32 retracts upon such contact and thereby results in secure contact being made between the pad(s) 420 and the spring-loaded probe tip(s) 32 despite the contact being blind. As such, while soldered connections are generally used in conventional devices, the need for solder to be applied between the pad(s) 420 and the spring-loaded probe tip(s) 32 is eliminated.

With reference back to FIGS. 1 and 2, the PCBs 40 may be grounded to the aperture plate 20 and to each other by at least one of fasteners and epoxy bond 60. When cured, as shown in FIG. 2, the epoxy bond 60 may take the form of a shape defined by the crisscrossing PCBs 40. Thus, if the crisscrossing PCBs 40 are perpendicular to one another and provided at regular intervals, the epoxy bond 60 will be square. In addition, edges of the epoxy bond 60 may be turned upwardly along the corresponding PCBs 40 (see FIG. 13.)

With reference to FIGS. 1 and 6-8, the grounding element 50 is interposed between crisscrossing pairs of PCBs 40 at complementary notches 402 thereof. As shown in FIG. 6, the grounding element 50 includes a hairpin element 51, a first leg 52 and a second leg 53. The hairpin element 51 has a U-shaped cross-section with a cross beam and a pair of leg beams extending substantially in parallel from opposite ends of the cross beam. The first leg 52 extends from a distal end of one of the leg beams along a longitudinal axis of the leg beam. The second leg 53 extends from a distal end of the other of the leg beams along a longitudinal axis of the leg beam. The first and second legs 52 and 53 may be substantially parallel with one another and may have substantially similar lengths or, in some cases, different lengths that can accommodate other features of the PCBs 40.

In accordance with embodiments, the grounding element 50 (i.e., the hairpin element 51, the first leg 52 and/or the second leg 53) may be formed of beryllium copper (BeCu) or another similar material. In any case, at least the hairpin element 51 may be formed to be elastically responsive to compression of the first and second legs 52 and 53 together or to stretching of the first and second legs 52 and 53 apart. In accordance with further embodiments, the hairpin element 51, the first leg 52 and the second leg 53 are all elastically responsive to compression of the first and second legs 52 and 53 together or to stretching of the first and second legs 52 and 53 apart.

As shown in FIGS. 7 and 8, the first leg 52 may include a series of discrete leg portions 520 that are respectively attachable to the distal end of the leg beam of the hairpin element 51 and to adjacent discrete leg portions 520. Similarly, the second leg 53 may include a series of discrete leg portions 530 that are respectively attachable to the distal end of the leg beam of the hairpin element 51 and to adjacent discrete leg portions 530. The first and second legs 52 and 53 may include a same number of the discrete leg portions 520 and 530 or different numbers thereof. Moreover, the discrete leg portions 520 may have the same or different lengths or sizes than the discrete leg portions 530.

With particular reference to FIG. 7, the first leg 52 includes a spine element 54, one or more exterior facing elastic grip elements 55 and one or more interior facing elastic grip elements 56. The exterior facing elastic grip elements 55 face outwardly from the spine element 54 and are configured to grip a first one of the crisscrossing pairs of PCBs 40. Each exterior facing elastic grip element 55 includes first and second opposed exterior facing flanges 550 and first and second opposed elastic members 551 by which the first and second opposed exterior facing flanges 550 are elastically coupled to the spine element 54. The first and second opposed exterior facing flanges 550 cooperatively form a groove through which the corresponding PCB 40 can be slid during an assembly or disassembly operation. The interior facing elastic grip elements 56 face inwardly and are configured to grip a second one of the crisscrossing pairs of PCBs 40. Each of the interior facing elastic grip elements 56 includes an interior facing flange 560 and an elastic member

561 by which the interior facing flange 560 is elastically coupled to the spine element 54.

The second leg 53 includes a spine element 57, one or more exterior facing elastic grip elements 58 and one or more interior facing elastic grip elements 59. The exterior facing elastic grip elements 58 face outwardly from the spine element 58 and are configured to grip the first one of the crisscrossing pairs of PCBs 40. Each exterior facing elastic grip element 58 includes first and second opposed exterior facing flanges 580 and first and second opposed elastic members 581 by which the first and second opposed exterior facing flanges 580 are elastically coupled to the spine element 57. The first and second opposed exterior facing flanges 580 cooperatively form a groove through which the corresponding PCB 40 can be slid during an assembly or disassembly operation. The interior facing elastic grip elements 59 face inwardly and are configured to grip the second one of the crisscrossing pairs of PCBs 40. Each of the interior facing elastic grip elements 59 is constructed similarly as the interior facing elastic grip elements 56 and includes an interior facing flange and an elastic member by which the interior facing flange is elastically coupled to the spine element 57.

The interior facing flange 560 of the first leg 52 and the interior facing flange of the second leg 53 oppose one another and cooperatively form a groove through which the corresponding PCB 40 can be slid during an assembly or disassembly operation.

With particular reference to FIG. 8 and, in accordance with alternative embodiments, each of the interior facing elastic grip elements 56/59 may include first and second dimple arrays 70 that are respectively disposed along the respective spine elements 54 and 57 of the first and second legs 52 and 53. The first and second dimple arrays 70 are provided as protrusions from the spine elements 54 and 57 and may be arranged in respective columns or in respective staggered formations. Each dimple in the first and second dimple arrays 70 may have a unique or standardized size and shape.

Figure 9:
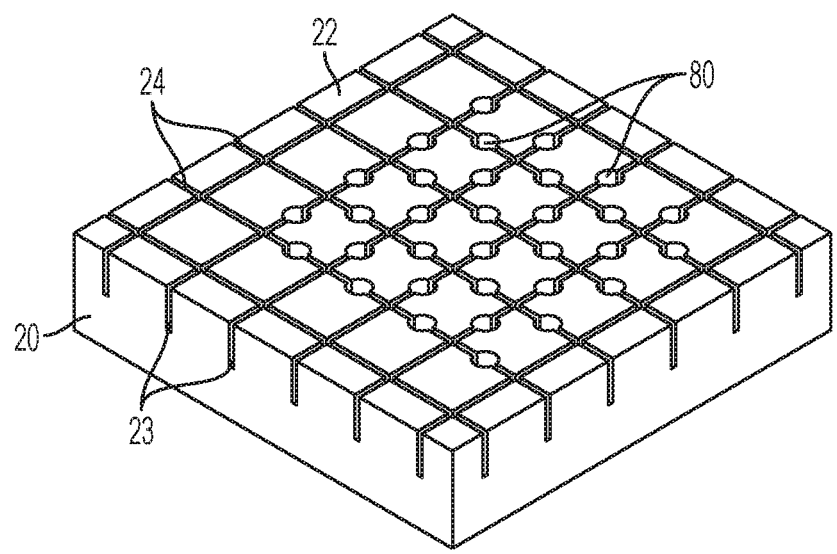
FIG. 9 is a perspective view of an aperture plate at an initial assembly stage in accordance with embodiments.
Figure 10:
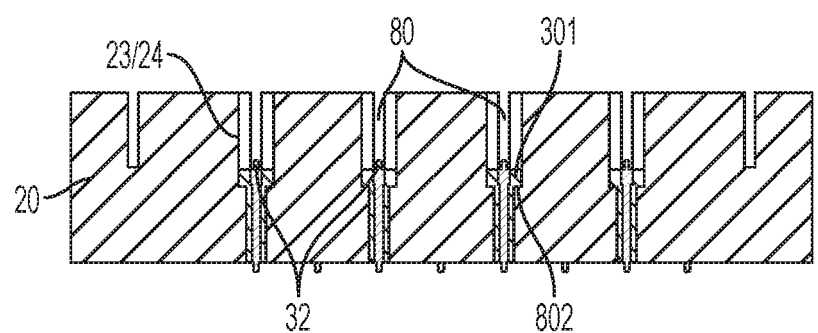
FIG. 10 is a side view of spring probes inserted into the aperture plate of FIG. 9.

With reference to FIGS. 9-13, a method of assembly of the radiator assembly 10 will now be described. As shown in FIG. 9, at an initial stage the method of assembly includes the provision of the first and second slots 23 and 24 in the planarized surface 22 of the aperture plate 20 as well as a machining of tubular recesses 80 along the first and second slots 23 and 24 in a matrix-like arrangement. The tubular recesses 80 are sized to tightly fit around the spring probes 30 such that the spring probes 30 may be supportively inserted into the tubular recesses 80 with the spring-loaded probe tips 32 substantially aligned with the first and second slots 23 and 24 (see FIG. 10). In accordance with embodiments, the tubular recesses 80 may include shoulder surfaces 802 that are supportive of corresponding flanges 301 of the spring probes 30 (see FIG. 10).

Figure 11:
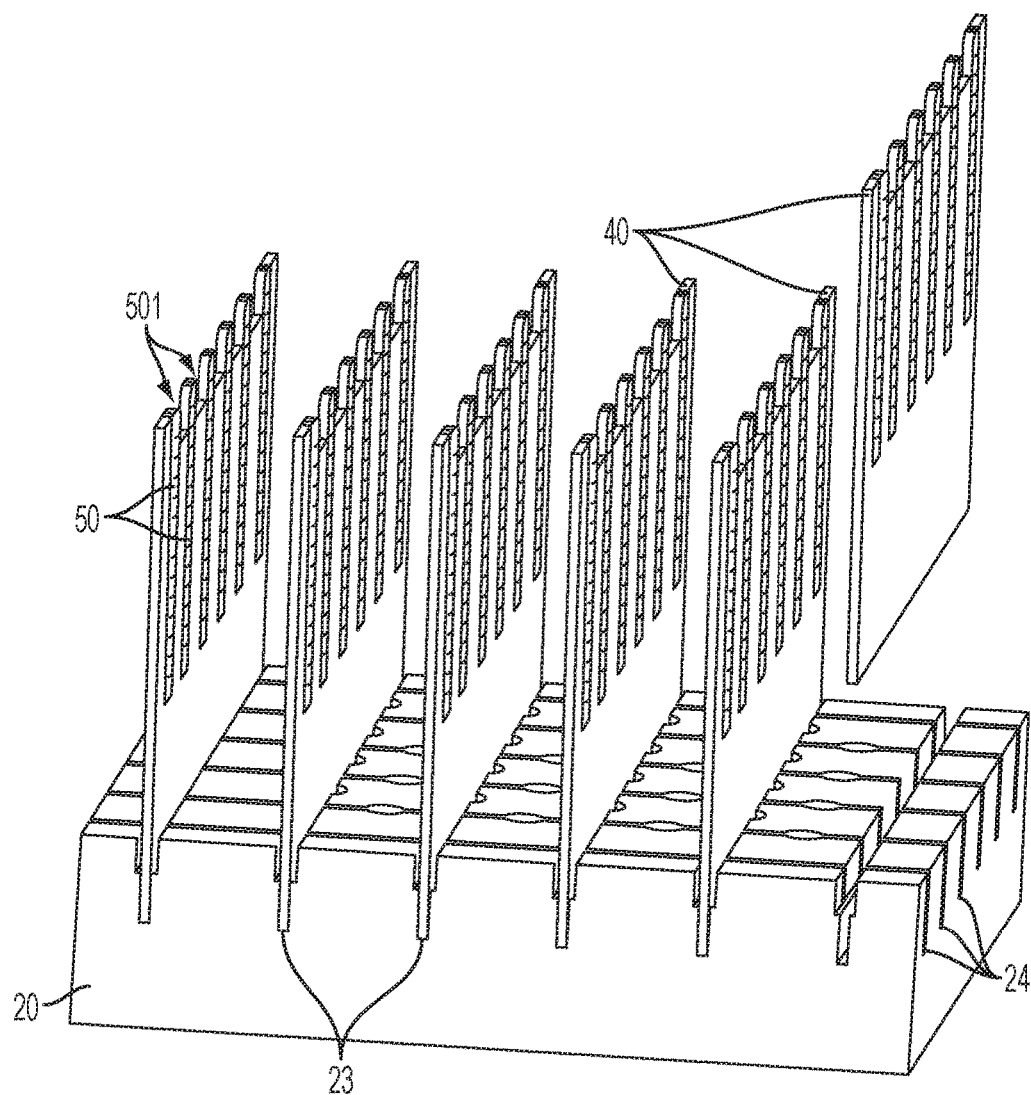
FIG. 11 is a perspective view of PCBs with grounding elements being inserted into first direction slots of the aperture plate of FIG. 9.
Figure 12:
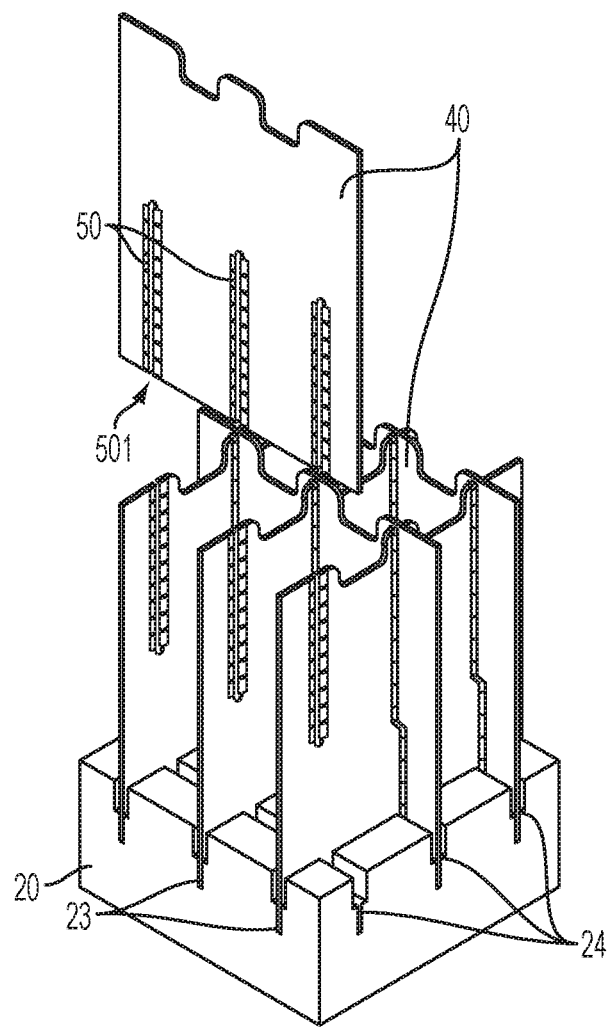
FIG. 12 is a perspective view of PCBs with grounding elements being inserted into second direction slots of the aperture plate of FIG. 9.

At a next assembly stage and, with reference to FIGS. 11 and 12, the grounding elements 50 are fit into grooves 501 that are formed in each of the PCBs 40 at the notches 402. In accordance with embodiments, the PCBs 40 to be inserted into the first slots 23 have grooves 501 that face upwardly (see FIG. 11) whereas the PCBs 40 to be inserted into the second slots 24 have grooves 501 that face downwardly (see FIG. 12). Thus, with the PCBs 40 inserted into the first slots 23 as shown in FIG. 11, the grounding elements 50 for those PCBs 40 face upwardly to slidably receive the PCBs 40 inserted into the second slots 24 as shown in FIG. 12. As noted above, the insertions of the PCBs 40 into the first and second slots 23 and 24 result in the spring-loaded probe tips 32 forming the horizontal blind-mate contacts in the respective planes of the PCBs 40.

Figure 13:
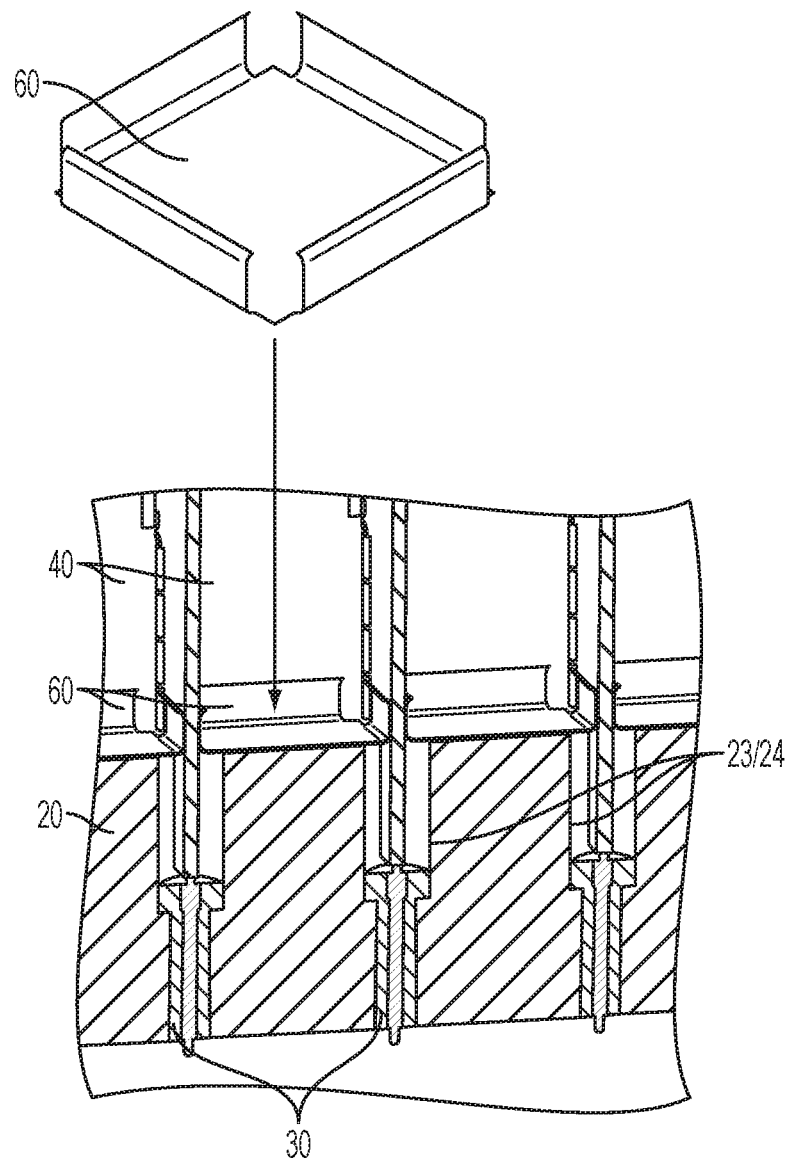
FIG. 13 is a perspective view of grounding elements being installed into a crisscrossing radiator PCB assembly.

At a final assembly stage and, with reference to FIG. 13, once the PCBs 40 are inserted into the first and second slots 23 and 24, the epoxy bonds 60 can be curably fit into the spaces defined between the PCBs 40.

Although FIGS. 1-3 illustrate that the radiator assembly 10 includes the embodiments of FIGS. 4 and 5 along with the embodiments of FIGS. 6-8 (i.e., the horizontal contacts are presented in combination with the grounding elements 50), it is to be understood that this combination of features is not required. That is, in accordance with embodiments, the radiator assembly 10 can include the horizontal contacts of FIGS. 4 and 5 along with another PCB-PCB grounding feature such as manual or automatic dispensation of epoxy. By contrast, in accordance with alternative embodiments, the radiator assembly 10 can include the grounding elements 50 of FIGS. 6-8 with another interconnection configuration.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The described embodiments were chosen and described in order to best explain the principles of the invention and the practical application, and to enable others of ordinary skill in the art to understand the invention for various embodiments with various modifications as are suited to the particular use contemplated.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A grounding element for a radiator, comprising:
   a hairpin element; and
   first and second legs extending substantially in parallel with each other from opposite ends of the hairpin element,
   each of the first and second legs comprising an exterior facing elastic grip element and an interior facing elastic grip element.

2. The grounding element according to claim 1, wherein the hairpin element and the first and second legs are formed of Beryllium Copper (BeCu).

3. The grounding element according to claim 1, wherein the hairpin element is elastic.

4. The grounding element according to claim 1, wherein each of the first and second legs comprises a series of discrete leg portions that are attachable to the hairpin element and to an adjacent discrete leg portion.

5. The grounding element according to claim 1, wherein each of the first and second legs comprises a spine element and each of the exterior facing elastic grip elements comprises:
first and second opposed exterior facing flanges; and
first and second opposed elastic members by which the first and second opposed exterior facing flanges are elastically coupled to the corresponding spine element.

6. The grounding element according to claim 1, wherein each of the first and second legs comprises a spine element and each of the interior facing elastic grip elements comprises:
first and second opposed interior facing flanges;
a first elastic member by which the first interior facing flange is elastically coupled to the spine element of the first leg; and
a second elastic member by which the second interior facing flange is elastically coupled to the spine element of the second leg.

7. The grounding element according to claim 1, wherein each of the first and second legs comprises a spine element and each of the interior facing elastic grip elements comprises first and second dimple arrays respectively disposed along the respectivety spine elements of the first and second legs.

8. A grounding element, comprising:
a hairpin; and
first and second legs extending from opposite ends of the hairpin,
each of the first and second legs comprising an exterior facing elastic grip and an interior facing elastic grip.

9. The grounding element according to claim 8, wherein the hairpin and the first and second legs are formed of Beryllium Copper (BeCu).

10. The grounding element according to claim 8, wherein the hairpin is elastic.

11. The grounding element according to claim 8, wherein each of the first and second legs comprises discrete leg portions attachable to the hairpin and an adjacent discrete leg portion.

12. The grounding element according to claim 8, wherein each of the first and second legs comprises a spine and each of the exterior facing elastic grips comprises:
first and second opposed exterior facing flanges; and
first and second opposed elastic members by which the first and second opposed exterior facing flanges are elastically coupled to the corresponding spine.

13. The grounding element according to claim 8, wherein each of the first and second legs comprises a spine and each of the interior facing elastic grip elements comprises:
first and second opposed interior facing flanges;
a first elastic member by which the first interior facing flange is elastically coupled to the spine of the first leg; and
a second elastic member by which the second interior facing flange is elastically coupled to the spine of the second leg.

14. The grounding element according to claim 8, wherein each of the first and second legs comprises a spine and each of the interior facing elastic grip elements comprises first and second dimple arrays respectively disposed along the respectively spines.

15. A grounding element, comprising:
a hairpin; and
first and second legs extending from opposite ends of the hairpin,
the first leg comprising a spine, an exterior facing elastic grip elastically coupled to the spine and an interior facing elastic grip elastically coupled to or disposed along the spine, and
the second leg comprising a spine, an exterior facing elastic grip elastically coupled to the spine and an interior facing elastic grip elastically coupled to or disposed along the spine.

16. The grounding element according to claim 15, wherein the hairpin and the first and second legs are formed of Beryllium Copper (BeCu).

17. The grounding element according to claim 15, wherein the hairpin is elastic.

18. The grounding element according to claim 15, wherein each of the exterior facing elastic grips of the first and second legs comprises:
first and second opposed exterior facing flanges; and
first and second opposed elastic members by which the first and second opposed exterior facing flanges are elastically coupled to the corresponding spine.

19. The grounding element according to claim 15, wherein each of the interior facing elastic grips of the first and second legs comprises:
first and second opposed interior facing flanges;
a first elastic member by which the first interior facing flange is elastically coupled to the spine of the first leg; and
a second elastic member by which the second interior facing flange is elastically coupled to the spine of the second leg.

20. The grounding element according to claim 16, wherein each of the interior facing elastic grip elements of the first and second legs comprises first and second dimple arrays respectively disposed along the respective spines.

* * * * *